(12) United States Patent
Sakata

(10) Patent No.: US 9,343,052 B2
(45) Date of Patent: May 17, 2016

(54) D/A CONVERSION APPARATUS, D/A CONVERSION METHOD AND ELECTRIC MUSICAL INSTRUMENT

(71) Applicant: CASIO COMPUTER CO., LTD., Tokyo (JP)

(72) Inventor: Goro Sakata, Hamura (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 14/661,410

(22) Filed: Mar. 18, 2015

(65) Prior Publication Data

US 2015/0270848 A1 Sep. 24, 2015

(30) Foreign Application Priority Data

Mar. 20, 2014 (JP) .................................. 2014-058360

(51) Int. Cl.
| | |
|---|---|
| *G10H 1/06* | (2006.01) |
| *G10H 1/34* | (2006.01) |
| *H03M 3/00* | (2006.01) |
| *G10H 7/00* | (2006.01) |

(52) U.S. Cl.
CPC ............... *G10H 1/34* (2013.01); *G10H 7/002* (2013.01); *H03M 3/388* (2013.01); *G10H 2240/071* (2013.01); *G10H 2250/545* (2013.01); *H03M 3/506* (2013.01)

(58) Field of Classification Search
CPC ....... G06F 7/602; H03M 3/506; H03M 3/344; H03M 3/43; H03M 3/50; H03M 1/822; H03M 3/464; H03M 7/3022; H03M 3/456; H03M 3/502; H03M 7/3026; H03M 1/66; H03M 3/504; H03M 3/432; H03M 3/30; H03M 3/46; H03M 7/302; H03M 7/3024

See application file for complete search history.

(56) References Cited

U.S. PATENT DOCUMENTS

| | | | |
|---|---|---|---|
| 6,373,417 B1 * | 4/2002 | Melanson | H03M 3/506 341/143 |
| 6,795,004 B2 | 9/2004 | Masuda et al. | |
| 7,327,296 B1 * | 2/2008 | Gaboriau | H03M 3/358 341/143 |

(Continued)

FOREIGN PATENT DOCUMENTS

| | | |
|---|---|---|
| JP | 4888837 B2 | 2/2012 |
| WO | 03/030373 A1 | 4/2003 |

OTHER PUBLICATIONS

Japanese Office Action dated Mar. 14, 2016 from Japanese Patent Application No. 2014-058360.

*Primary Examiner* — Marlon Fletcher

(74) *Attorney, Agent, or Firm* — Scully, Scott, Murphy & Presser, P.C.

(57) ABSTRACT

In the present embodiment, quantizer output values including variation values corresponding to duty errors of pulse width data (PWM output signals) occurring by the difference of the pull-down/pull-up drive characteristics (drive capabilities) of a buffer are stored in advance in a feedback value memory in a quantizer as feedback values FBV0 to FBV4, and a feedback value FBVn read out from the feedback value memory in response to the quantization of a delta-sigma modulation output is inputted into a subtractor by return input. Then, a quantizer output value including a variation value corresponding to a duty error is subtracted from input data Din, and delta-sigma modulation is performed such that the difference is minimized, whereby the duty error of pulse width data (PWM output signal) is compensated.

6 Claims, 9 Drawing Sheets

(56) References Cited

U.S. PATENT DOCUMENTS

| | | | |
|---|---|---|---|
| 2004/0046680 A1 | 3/2004 | Masuda et al. | |
| 2004/0212524 A1* | 10/2004 | Komarura | H02M 1/088 341/143 |
| 2005/0052304 A1* | 3/2005 | Trotter | H03M 3/506 341/152 |
| 2007/0083277 A1* | 4/2007 | Mallinson | H03M 7/302 700/94 |
| 2007/0182610 A1* | 8/2007 | Latham | H03M 3/344 341/143 |
| 2008/0316073 A1* | 12/2008 | Okada | H03M 3/358 341/118 |
| 2010/0315275 A1* | 12/2010 | Murahashi | H03F 3/2173 341/143 |
| 2011/0187566 A1* | 8/2011 | Soenen | H03H 17/00 341/110 |
| 2012/0242521 A1* | 9/2012 | Kinyua | H03M 7/3022 341/143 |
| 2015/0171887 A1* | 6/2015 | Okuda | H03M 3/372 341/143 |
| 2015/0270848 A1* | 9/2015 | Sakata | H03M 3/372 84/744 |

* cited by examiner

PRIOR ART

PRIOR ART

PRIOR ART

D/A CONVERSION APPARATUS, D/A CONVERSION METHOD AND ELECTRIC MUSICAL INSTRUMENT

CROSS-REFERENCE TO RELATED APPLICATION

This application is based upon and claims the benefit of priority from the prior Japanese Patent Application No. 2014-058360, filed Mar. 20, 2014, the entire contents of which are incorporated herein by reference.

BACKGROUND OF THE INVENTION

1. Field of the Invention

The present invention relates to a D/A (Digital-to-Analog) conversion apparatus and a D/A conversion method that are suitable for, for example, an electric musical instrument or the like, and an electric musical instrument with the D/A conversion apparatus.

2. Description of the Related Art

A D/A conversion apparatus is conventionally known which uses a delta-sigma modulator that produces a noise shaping effect of shifting quantization noise to a high-pass side so as to improve a S/N (Signal-to-Noise) ratio in an audible band. As this type of apparatus, Japanese Patent No. 4888837 discloses a D/A conversion apparatus including a delta-sigma modulator which performs delta-sigma modulation on an input signal according to a first clock and generates a delta-sigma modulated output; a timing generator which generates a start signal indicating the start of a time slot assigned as the processing time of the delta-sigma modulator per sample based on the first clock and a second clock that is asynchronous with the first clock, and generates a completion signal indicating the completion of delta-sigma modulation processing by the delta-sigma modulator; and an output conversion section which converts the delta-sigma modulated output generated by the delta-sigma modulator in synchronization with the first clock into an output signal (PWM—Pulse Width Modulation) output signal) synchronized with the second clock, according to the start signal and the completion signal generated by the timing generator. This D/A conversion apparatus can be easily mounted in a high-order system, such as ASIC (Application Specific Integrated Circuit) and FPGA (Field Programmable Gate Array), and can avoid the effect of a jitter (time-base error) without requiring a complicated apparatus structure.

However, this D/A conversion apparatus disclosed in Japanese Patent No. 4888837, which uses delta-sigma modulation with PWM (Pulse Width Modulation), has the following problem. Hereafter, this problem will be described with reference to FIG. 7A to FIG. 9.

Normally, in the interface of a D/A conversion apparatus constituted by a digital circuit and an analog circuit section used as the subsequent stage, a buffer that serves as an output element is commonly provided, whereby a PWM output signal outputted from the D/A conversion apparatus is supplied to the analog circuit section used as the subsequent stage.

In the buffer which drives a PWM output signal, a drive characteristic of drawing an electric current and performing pull-down to the "L" level from the "H" level as shown in FIG. 7A and a drive characteristic of emitting an electric current and performing pull-up to the "H" level from the "L" level as shown in FIG. 7B are different. That is, in the buffer, the drive capability to transition from the "H" level to the "L" level and the drive capability to transition from the "L" level to the "H" level are different.

In order for the D/A conversion apparatus to operate ideally, the amount of current to be "drawn" (a shaded area "a" in FIG. 8) and the amount of current to be emitted (a shaded area "b" in FIG. 8) should preferably be the same irrespective of the voltage before the transition, as shown in FIG. 8. However, when the pull-down and pull-up characteristics (drive capabilities) differ from each other as described above, a delay time $\Delta t1$ when transition is performed from "L" level to "H" level and a delay time $\Delta t2$ when transition is performed from "H" level to "L" level differ as shown in FIG. 9, which causes a duty error of a PWM output signal to occur. As a result, the conversion accuracy is degraded.

SUMMARY OF THE INVENTION

The present invention has been conceived in view of the above-described problem. An object of the present invention is to provide a D/A conversion apparatus, a D/A conversion method, and an electric musical instrument in which conversion accuracy is improved by eliminating duty errors of PWM (Pulse Width Modulation) output signals.

In order to achieve the above-described object, in accordance with one aspect of the present invention, there is provided a D/A conversion apparatus comprising: a subtractor into which digital data is inputted; a delta-sigma modulator which performs delta-sigma modulation on the digital data outputted from the subtractor; a quantizer which quantizes an output of the delta-sigma modulator; a pulse width modulation output device which outputs a pulse width modulation signal having a duty ratio based on the output quantized by the quantizer; and an output element which outputs an analog signal whose level corresponds to the duty ratio of the pulse width modulation signal from the pulse width modulation output device, wherein the quantizer reads out an error portion of the pulse width modulation signal caused by drive characteristics of the output element from a memory corresponding to the output of the delta-sigma modulator, and supplies the error portion to the subtractor, and wherein the subtractor subtracts the error portion of the pulse width modulation signal from the digital data inputted, and supplies the digital data to the delta-sigma modulator.

In accordance with another aspect of the present invention, there is provided a D/A conversion method for a D/A conversion apparatus including a subtractor into which digital data is inputted, a delta-sigma modulator which performs delta-sigma modulation on the digital data outputted from the subtractor, a quantizer which quantizes an output of the delta-sigma modulator, a pulse width modulation output device which outputs a pulse width modulation signal having a duty ratio based on the quantized output of the delta-sigma modulator, and an output element which outputs an analog signal whose level corresponds to the duty ratio of the pulse width modulation signal from the pulse width modulation output device, wherein the quantizer reads out an error portion of the pulse width modulation signal caused by drive characteristics of the output element from a memory corresponding to the output of the delta-sigma modulator, and supplies the error portion to the subtractor, and wherein the subtractor subtracts the error portion of the pulse width modulation signal from the digital data inputted, and supplies the digital data to the delta-sigma modulator.

The above and further objects and novel features of the present invention will more fully appear from the following detailed description when the same is read in conjunction with the accompanying drawings. It is to be expressly under-

DETAILED DESCRIPTION OF THE PREFERRED EMBODIMENTS

Figure 1:
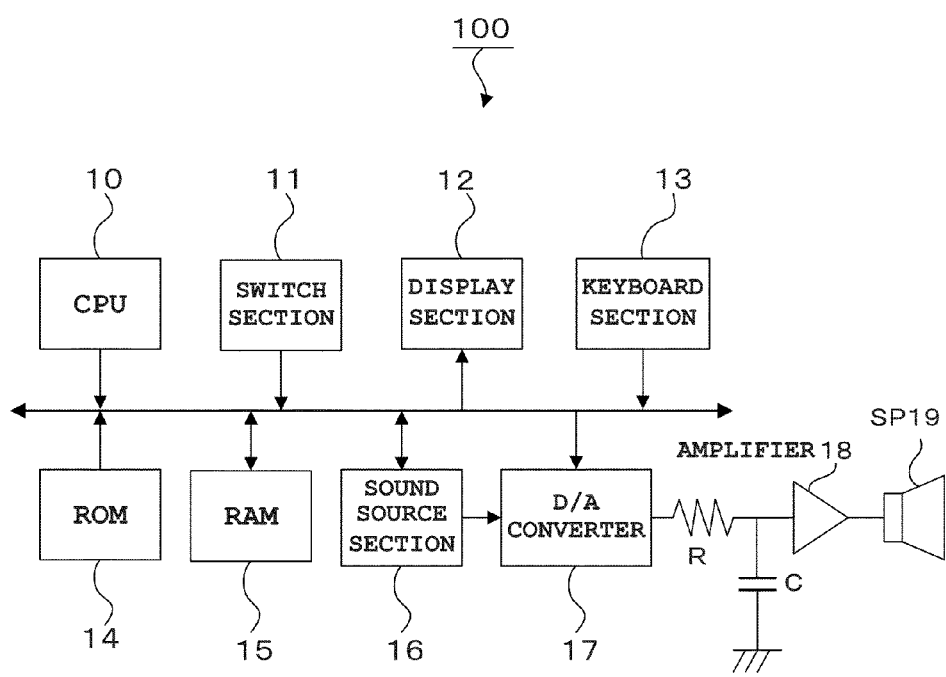
FIG. 1 is a block diagram showing the entire structure of an embodiment of the present invention.

An embodiment of the present invention will hereinafter be described with reference to the drawings. FIG. 1 is a block diagram showing the entire structure of an electric musical instrument 100 including a D/A conversion apparatus (D/A converter 17) according to the embodiment of the present invention. A CPU (Central Processing Unit) 10 in FIG. 1 sets the processing operation of each section of the apparatus based on a switch event outputted from a switch section 11, or instructs a sound source section 16 to generate a musical sound based on musical performance information outputted from a keyboard section 13. Also, this CPU 10 transmits threshold value data (threshold values TH0 to TH4) and a feedback data FBV group to a quantizer 40 (described later) from the data area of a RAM (Random Access Memory) 15 when initialization is performed after power-on.

The switch section 11 is constituted by a power switch, a tone selection switch, etc., and generates a switch event of a type corresponding to a switch operation. The switch event generated by the switch section 11 is loaded into the CPU 10. A display section 12 in FIG. 1 is constituted by a liquid-crystal-display panel and the like, and displays on its screen the setting status, the operation status, and the like of each section of the apparatus under the control of the CPU 10. The keyboard section 13 generates musical performance information including a key-ON/key-OFF event, a note number (or a key number), and velocity based on a key depression and release operation (musical performance operation), and provides it to the CPU 10.

A ROM (Read-Only Memory) 14 in FIG. 1 stores various programs to be executed by the CPU 10. The RAM 15 includes a work area and a data area. In the work area of the RAM 15, various register and flag data for use in processing by the CPU 10 is temporarily stored. In the data area, threshold value data (threshold values TH0 to TH4) and a feedback data FBV group to be transmitted to the quantizer 40 described later are stored. The objective of these threshold value data (threshold values TH0 to TH4) and feedback data FBV group will be described later. The sound source section 16 includes a plurality of sound-emission channels constituted by a known waveform memory read method, and generates musical sound waveform data W in accordance with a note-ON/note-OFF event provided from the CPU 10.

The D/A converter 17 converts musical sound waveform data W outputted from the sound source section 16 into an analog musical sound signal, and outputs it. In the next area of the D/A converter 17, an RC (Resistor-Capacitor) integration circuit is provided. By this RC integration circuit, a musical sound signal outputted from the D/A converter 17 is subjected to low-pass filtering for removing unnecessary high-pass noise therefrom, and then amplified in an amplifier 18 for sound emission from a loudspeaker 19.

Figure 2:
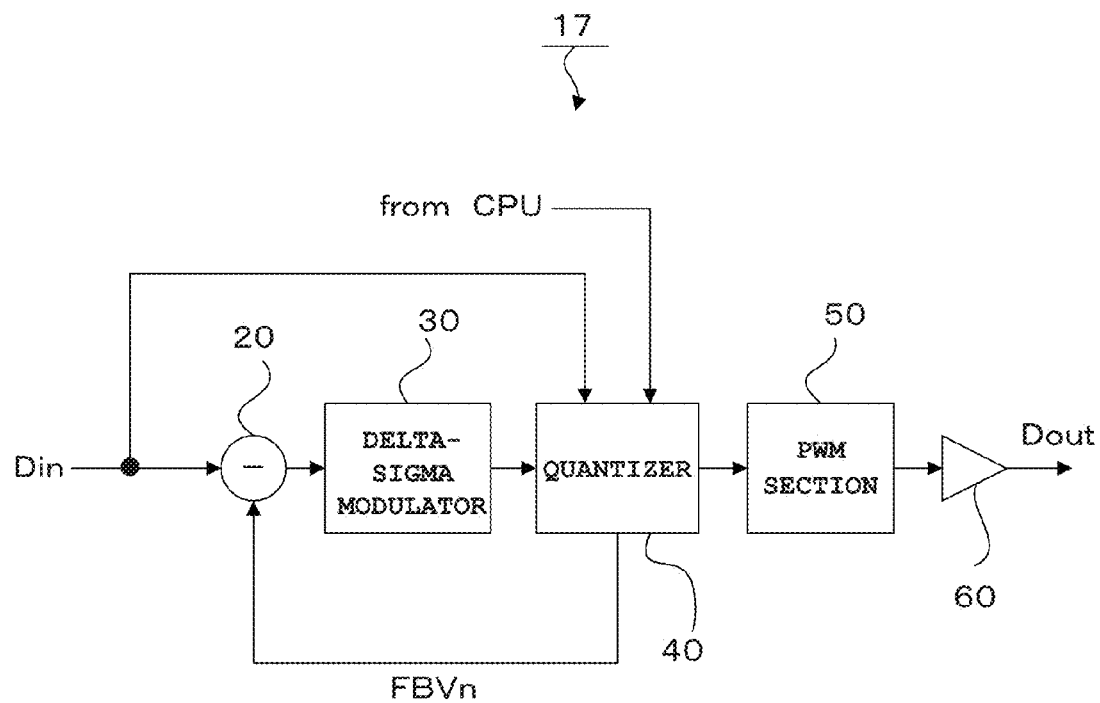
FIG. 2 is a block diagram showing the structure of a D/A converter 17.
Figure 3:
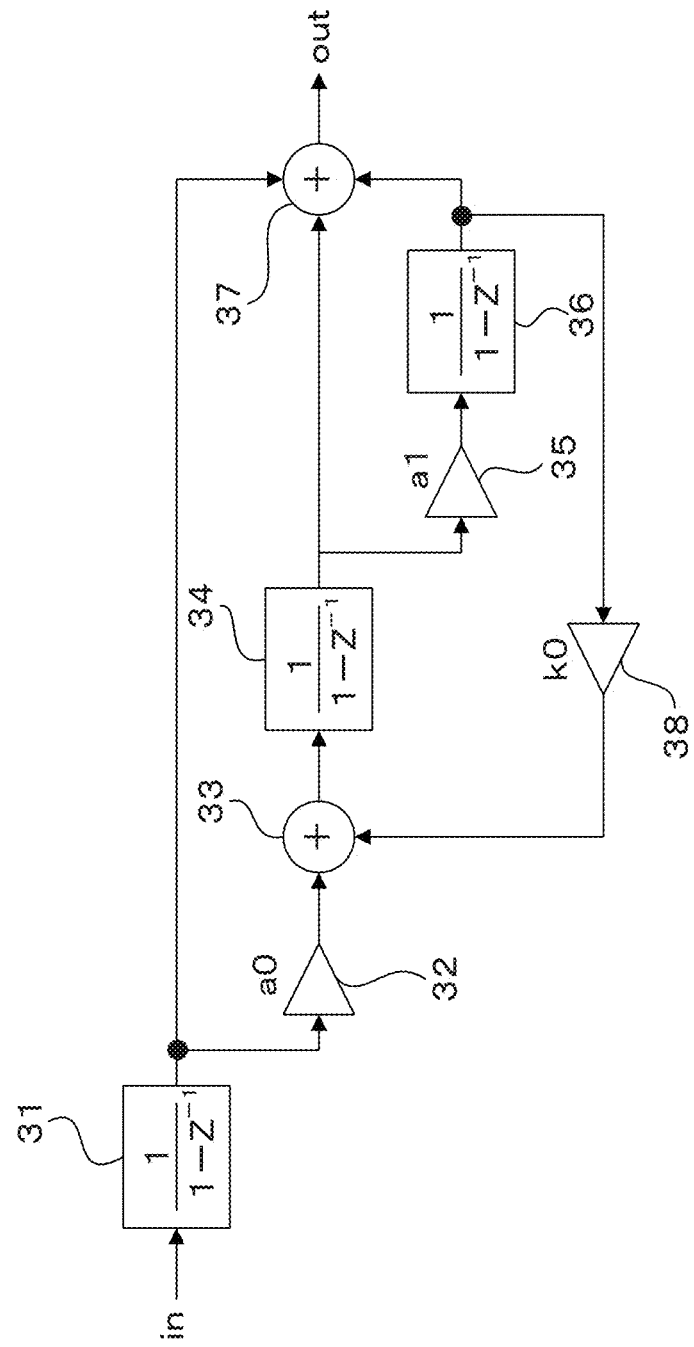
FIG. 3 is a block diagram showing the structure of a delta-sigma modulator 30.
Figure 4:
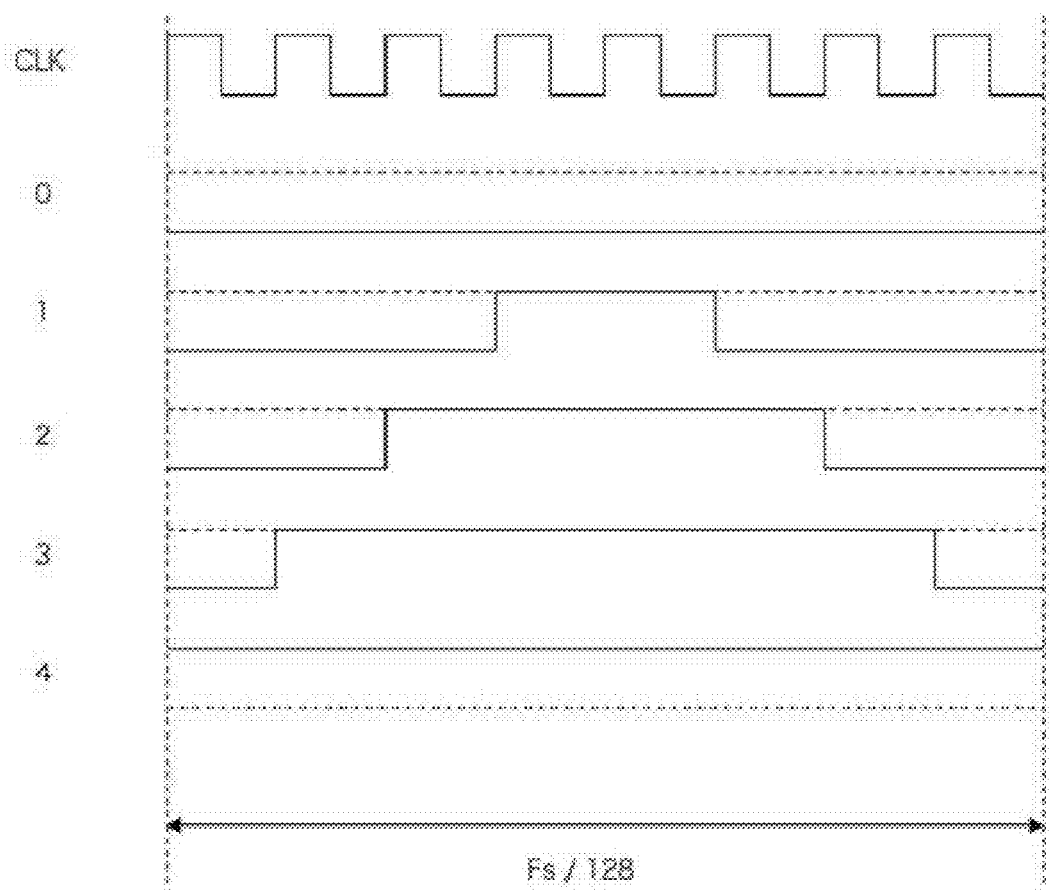
FIG. 4 is a diagram showing pulse width data (PWM output signal) outputted from a PWM output device 50.

Next, the D/A converter 17 according the embodiment of the present invention will be described with reference to FIG. 2 to FIG. 6. FIG. 2 is a block diagram showing the entire structure of the D/A converter 17. A subtractor 20 in FIG. 2 subtracts a feedback value FBVn (described later) inputted by feedback input from input data Din and outputs it. A delta-sigma modulator 30 in FIG. 2 is constituted by an integrator 31, a multiplier 32, an adder 33, an integrator 34, a multiplier 35, an integrator 36, an adder 37, and a multiplier 38, as shown in the example of FIG. 3. This delta-sigma modulator 30 performs third delta-sigma modulation coding on an input signal "in" and generates a delta-sigma modulation output "out".

A quantizer 40 in FIG. 2 quantizes a delta-sigma modulation output "out" outputted from the delta-sigma modulator 30 to five values of "0" to "4" and outputs it. The structure of this quantizer 40 will be described later. A PWM output device 50 in FIG. 2 generates pulse width data shown in FIG. 4 when output values of the quantizer 40 are five values of "0" to "4". That is, in a case where one time slot has been constituted by eight clock signals (Fs/128), when an output value of the quantizer 40 is "0", all of the eight clock signals generate pulse width data of "0". When the output value of the quantizer 40 is "1", two clock signals in the middle of the eight clock signals generate pulse width data of "1". Similarly, when the output value of the quantizer 40 is "2", "3", or "4", four clock signals in the middle of the eight clock signals, six clock signals in the middle of the eight clock signals, or all of the clock signals generate pulse width data of "1", respectively.

Figure 9:
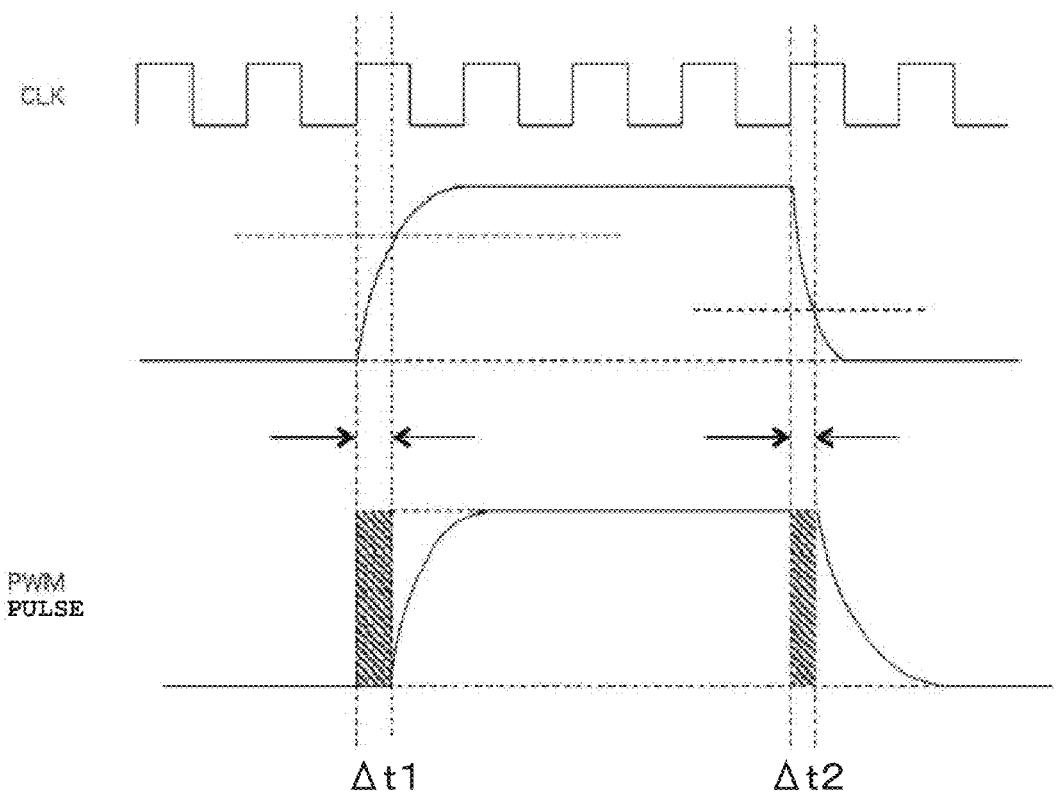
FIG. 9 is a diagram showing a delay time $\Delta t1$ and a delay time $\Delta t2$ of a PWM output signal.

A buffer 60 in FIG. 2 provides pulse width data (PWM output signal) outputted from the PWM output device 50 to an analog circuit section (RC integration circuit) next to the buffer 60. In this buffer 60, pull-down and pull-up characteristics (drive capabilities) differ from each other as described above. As a result, a delay time $\Delta t1$ when transition is performed from "L" level to "H" level and a delay time $\Delta t2$ when transition is performed from "H" level to "L" level differ as shown in FIG. 9, which causes a duty error of pulse width data (PWM output signal) to occur. As a result, the conversion accuracy is degraded.

Figure 5:
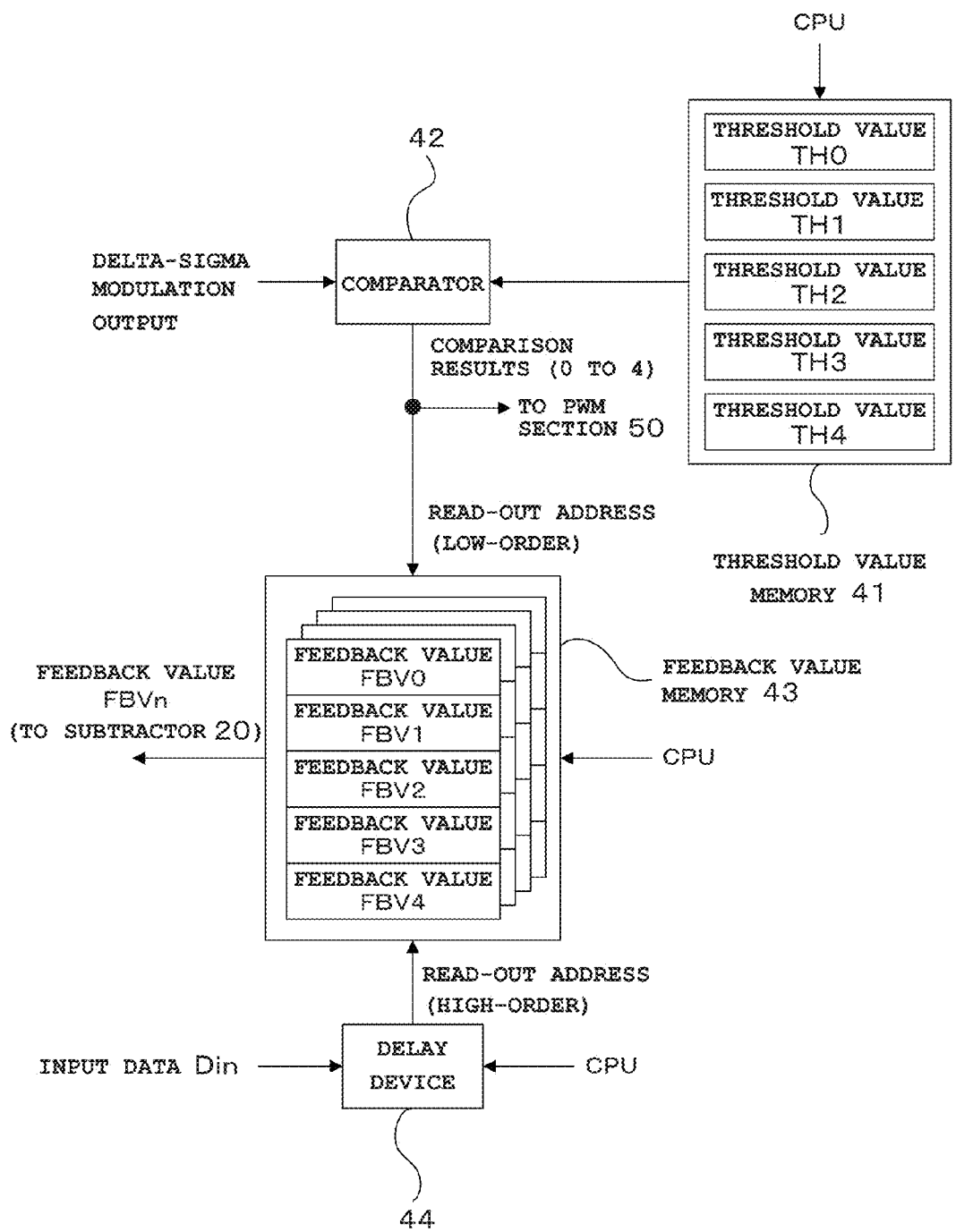
FIG. 5 is a block diagram showing the structure of a quantizer 40.
Figure 6:
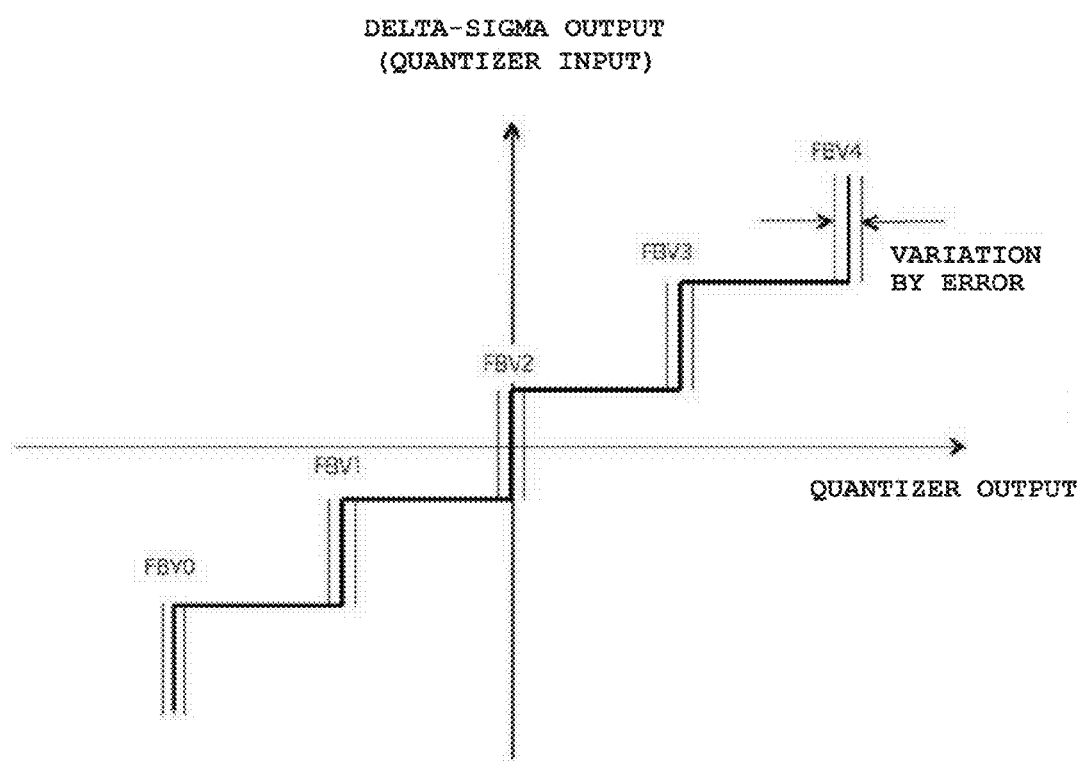
FIG. 6 is a graph for describing feedback values FBV0 to FBV4.
Figure 7A:
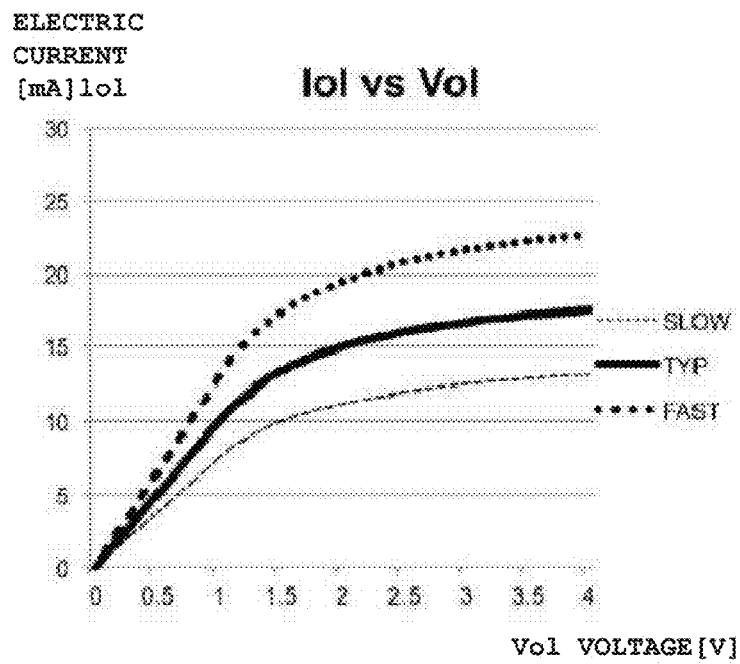
FIGS. 7A and 7B are graphs showing examples of pull-down and pull-up drive characteristics of a buffer.
Figure 7B:
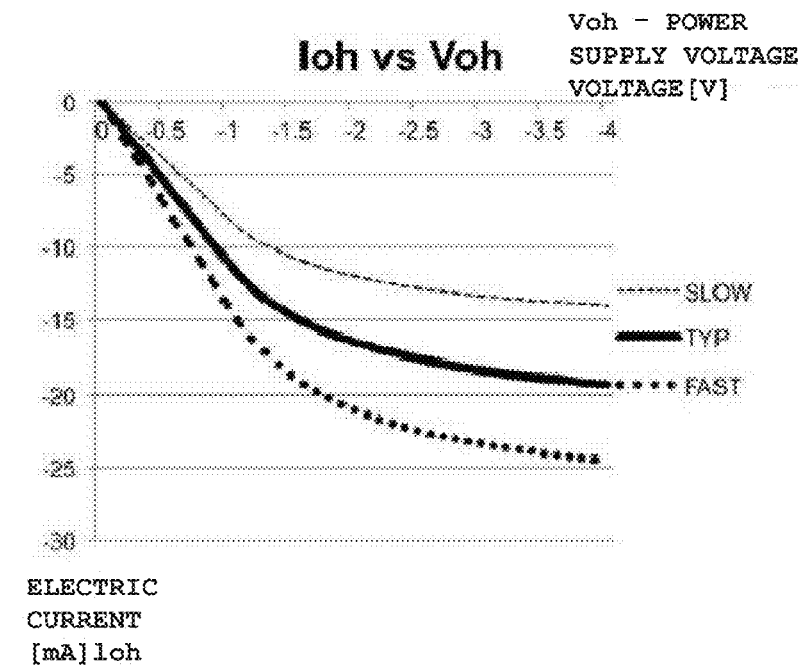
Figure 8:
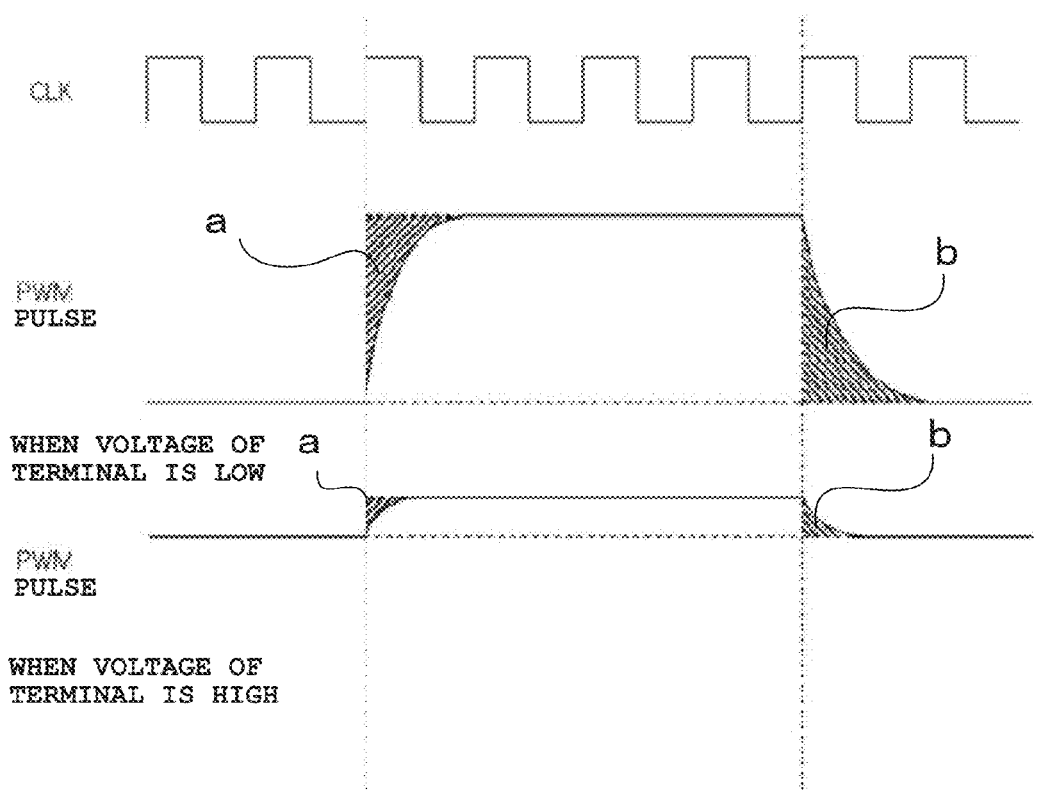
FIG. 8 is a diagram showing the amount of current (shaded area "a") "drawn" into a buffer and the amount of current (shaded area "b") emitted from the buffer.

Accordingly, in the present invention, the quantizer 40 has a structure that compensates for duty errors, and thereby improves the accuracy of D/A conversion. Hereafter, the structure of this quantizer 40 will be described with reference to FIG. 5 and FIG. 6. FIG. 5 is a block diagram showing the structure of the quantizer 40, in which the quantizer 40 has been constituted by a threshold value memory 41, a comparator 42, a feedback value memory 43, and a delay device 44.

In the threshold value memory 41, threshold values TH0 to TH4 transmitted from the data area of the RAM 15 under the control of the CPU 10 are stored. The threshold values TH0 to TH4 are integers "0" to "4" for quantizing a delta-sigma modulation output to five values. The comparator 42 compares a delta-sigma modulation output with the threshold values TH0 to TH4 stored in the threshold value memory 41, and generates a comparison result ("0" to "4"). Then, the comparison result is provided to the PWM output device 50 next to the quantizer 40, and also serves as a read-out address (low-order) for the feedback value memory 43.

In the feedback value memory 43, a feedback data FBV group transmitted from the data area of the RAM 15 under the control of the CPU 10 is stored. This feedback data FBV group is constituted by plural sets of feedback values FBV0 to FBV4. The feedback values FBV0 to FBV4 of one set are values experimentally acquired in advance based on the drive characteristic of the buffer 60 which is driven at a certain output voltage.

Specifically, the feedback values FBV0 to FBV4 are quantizer output values including values of variation corresponding to duty errors of pulse width data (PWM output signals) occurring due to the difference of the pull-down and pull-up drive characteristics of the buffer 60. That is, although ideal quantizer output values without duty errors are quantizer output values such as those shown by the stair-like thick line in FIG. 6, in actuality, variation values corresponding to duty errors are included in quantizer output values corresponding to the threshold values TH0 to TH4, and therefore quantizer output values corresponding to the respective threshold values TH0 to TH4 and including these variation values are used as the feedback values FBV0 to FBV4.

The delay device 44 performs the delay output of input data Din under the control of the CPU 10. The input data Din outputted from the delay device 44 by the delay output serves as a read-out address (high-order) for the feedback value memory 43. This input data Din is used as a read-out address (high-order) for the feedback value memory 43 because it can be approximated to the output voltage of the buffer 60.

Accordingly, in the feedback value memory 43, feedback values FBV0 to FBV4 of a set corresponding to the output voltage of the buffer 60 are selected from among plural sets of feedback values FBV0 to FBV4 based on the above-described read-out address (high-order), and one of the feedback values FBV0 to FBV4 of the selected set is read out as a feedback value FBVn, with the above-described comparison result by the comparator 42 as a read-out address (low-order).

Then, the feedback value FBVn read out from the feedback value memory 43 is inputted into the above-described subtractor 20 (refer to FIG. 2) by feedback input. As a result, the delta-sigma modulator 30 is operated such that a difference acquired by subtracting a quantizer output value including a variation value corresponding to a duty error of the input data Din is minimized, whereby the duty error of the PWM output signal is eliminated and the conversion accuracy is improved.

As described above, in the present embodiment, quantizer output values including variation values corresponding to duty errors of pulse width data (PWM output signals) occurring by the difference of the pull-down and pull-up drive characteristics (drive capabilities) of the buffer 60 are stored in advance in the feedback value memory 43 as feedback values FBV0 to FBV4; a feedback value FBVn read out from the feedback value memory 43 in response to the quantization of a delta-sigma modulation output is inputted into the subtractor 20 by return input; a quantizer output value including a variation value corresponding to a duty error is subtracted from input data Din; and delta-sigma modulation is performed such that the difference is minimized, whereby the duty error of pulse width data (PWM output signal) is compensated. As a result of this configuration, the duty error of a PWM output signal is eliminated, and the conversion accuracy can be improved.

Also, in the present embodiment, plural sets of feedback values FBV0 to FBV4 corresponding to the output voltage of the buffer 60 are stored in advance in the feedback value memory 43; feedback values FBV0 to FBV4 of a set corresponding to input data Din that can be approximated to the output voltage of the buffer 60 are selected from among the plural sets of feedback values FBV0 to FBV4; a feedback value FBVn read out from among the feedback values FBV0 to FBV4 of the selected set in response to the quantization of a delta-sigma modulation output is inputted into the subtractor 20 by return input; a quantizer output value including a variation value corresponding to a duty error is subtracted from input data Din; and delta-sigma modulation is performed such that the difference is minimized, whereby the duty error of pulse width data (PWM output signal) is compensated. As a result of this configuration, the duty error of a PWM output signal is eliminated, and the conversion accuracy can be improved.

In the above-described embodiment, the difference of pull-down/pull-up drive characteristics (drive capabilities) which changes according to the operating temperature of the buffer 60 has not been described. However, a configuration may be adopted which includes a temperature detection section which detects the operating temperature of the buffer 60 and a temperature compensation section which performs temperature compensation for a feedback value FBVn read out from the feedback value memory 43 based on the operating temperature of the buffer 60 detected by the temperature detection section, whereby the duty error of pulse width data (PWM output signal) can be compensated following the change of the operating temperature of the buffer 60.

While the present invention has been described with reference to the preferred embodiments, it is intended that the invention be not limited by any of the details of the description therein but includes all the embodiments which fall within the scope of the appended claims.

What is claimed is:
1. A D/A conversion apparatus comprising:
a subtractor into which digital data is inputted;
a delta-sigma modulator which performs delta-sigma modulation on the digital data outputted from the subtractor;
a quantizer which quantizes an output of the delta-sigma modulator;
a pulse width modulation output device which outputs a pulse width modulation signal having a duty ratio based on the output quantized by the quantizer;
an output element which outputs an analog signal whose level corresponds to the duty ratio of the pulse width modulation signal from the pulse width modulation output, device; and
a selector which selects a set of error portions corresponding to input data that can be approximated to the analog signal of the output element, from among plural sets of error portions stored in a memory,
wherein the memory stores the plural sets of error portions of pulse width modulation signals caused by the drive characteristics of different output elements corresponding to different analog signals of the different output elements,
wherein the quantizer reads out the error portion among the set of error portions selected by the selector corresponding to the output of the delta-sigma modulator, and supplies the error portion to the subtractor, and wherein the subtractor subtracts the error portion of the pulse width modulation signal from the digital data inputted, and supplies the digital data to the delta-sigma modulator.

2. A D/A conversion apparatus comprising:
a subtractor into which digital data is inputted;
a delta-sigma modulator which performs delta-sigma modulation on the digital data outputted from the subtractor;
a quantizer which quantizes an output of the delta-sigma modulator;
a pulse width modulation output device which outputs a pulse width modulation signal having a duty ratio based on the output quantized by the quantizer;
an output element which outputs an analog signal whose level corresponds to the duty ratio of the pulse width modulation signal from the pulse width modulation output device;
a temperature sensor which detects an operating temperature of the output element; and
a temperature compensation section which performs temperature compensation for the error portion of the pulse width modulation signal read out from a memory corresponding to the operating temperature of the output element detected by the temperature sensor,
wherein the quantizer reads out an error portion of the pulse width modulation signal caused by drive characteristics of the output element performed temperature compensation by the temperature compensation from the memory corresponding to the output of the delta-sigma modulator and supplies the error portion to the subtractor, and
wherein the subtractor subtracts the error portion of the pulse width modulation signal from the digital data inputted, and supplies the digital data to the delta-sigma modulator.

3. A D/A conversion method for a D/A conversion apparatus including a subtractor into which digital data is inputted, a delta-sigma modulator which performs delta-sigma modulation on the digital data outputted from the subtractor, a quantizer which quantizes an output of the delta-sigma modulator, a pulse width modulation output device which outputs a pulse width modulation signal having a duty ratio based on the quantized output of the delta-sigma modulator, an output element which outputs an analog signal whose level corresponds to the duty ratio of the pulse width modulation signal from the pulse width modulation output device and a selector,
wherein the selector selects a set of error portions corresponding to input data that can be approximated to the analog signal of the output element, from among plural sets of error portions of pulse width modulation signals caused by the drive characteristics of different output elements corresponding to different analog signals of the different output elements,
wherein the quantizer reads out the error portion among the set of error portions selected by the selector corresponding to the output of the delta-sigma modulator, and supplies the error portion to the subtractor, and
wherein the subtractor subtracts the error portion of the pulse width modulation signal from the digital data inputted, and supplies the digital data to the delta-sigma modulator.

4. An electric musical instrument comprising:
a D/A conversion apparatus;
a keyboard section which outputs musical performance information in accordance with a musical performance operation; and a sound source section which generates digital data of a musical sound according to the musical performance information outputted from the keyboard section, and outputs the generated digital data to the D/A conversion apparatus,
wherein the D/A conversion apparatus comprises a subtractor into which digital data is inputted, a delta-sigma modulator which performs delta-sigma modulation on the digital data outputted from the subtractor, a quantizer which quantizes an output of the delta-sigma modulator, a pulse width modulation output device which outputs a pulse width modulation signal having a duty ratio based on the output quantized by the quantizer, an output element which outputs an analog signal whose level corresponds to the duty ratio of the pulse width modulation signal from the pulse width modulation output device, and a selector which selects a set of error portions corresponding to input data that can be approximated to the analog signal of the output element, from among plural sets of error portions stored in a memory,
wherein the memory stores the plural sets of error portions of pulse width modulation signals caused by the drive characteristics of different output elements corresponding to different analog signals of the different output elements,
wherein the quantizer reads out the error portion among the set of error portions selected by the selector corresponding to the output of the delta-sigma modulator, and supplies the error portion to the subtractor, and
wherein the subtractor subtracts the error portion of the pulse width modulation signal from the digital data inputted, and supplies the digital data to the delta-sigma modulator.

5. A D/A conversion method for a D/A conversion apparatus including a subtractor into which digital data is inputted, a delta-sigma modulator which performs delta-sigma modulation on the digital data outputted from the subtractor, a quantizer which quantizes an output of the delta-sigma modulator, a pulse width modulation output device which outputs a pulse width modulation signal having a duty ratio based on the quantized output of the delta-sigma modulator, an output element which outputs an analog signal whose level corresponds to the duty ratio of the pulse width modulation signal from the pulse width modulation output device, a temperature sensor which detects an operating temperature of the output element, and a temperature compensation section which performs temperature compensation for the error portion of the pulse width modulation signal read out from a memory corresponding to the operating temperature of the output element detected by the temperature sensor,
wherein the quantizer reads out an error portion of the pulse width modulation signal caused by drive characteristics of the output element performed temperature compensation by the temperature compensation section from the memory corresponding to the output of the delta-sigma modulator, and supplies the error portion to the subtractor, and
wherein the subtractor subtracts the error portion of the pulse width modulation signal from the digital data inputted, and supplies the digital data to the delta-sigma modulator.

6. An electric musical instrument comprising:
a D/A conversion apparatus;
a keyboard section which outputs musical performance information in accordance with a musical performance operation; and a sound source section which generates digital data of a musical sound according to the musical performance information outputted from the keyboard section, and outputs the generated digital data to the D/A conversion apparatus, wherein the D/A conversion apparatus comprises a subtractor into which digital data is inputted, a delta-sigma modulator which performs delta-sigma modulation on the digital data outputted from the subtractor, a quantizer which quantizes an output of the delta-sigma modulator, a pulse width modulation output device which outputs a pulse width modulation signal having a duty ratio based on the output quantized by the quantizer, an output element which outputs an analog signal whose level corresponds to the duty ratio of the pulse width modulation signal from the pulse width modulation output device, a temperature sensor which detects an operating temperature of the output element, and a temperature compensation section which performs temperature compensation for the error portion of the pulse width modulation signal read out from a memory corresponding to the operating temperature of the output element detected by the temperature sensor, wherein the quantizer reads out an error portion of the pulse width modulation signal caused by drive characteristics of the output element performed temperature compensation by the temperature compensation section from the memory corresponding to the output of the delta-sigma modulator, and supplies the error portion to the subtractor, and wherein the subtractor subtracts the error portion of the pulse width modulation signal from the digital data inputted, and supplies the digital data to the delta-sigma modulator.

* * * * *